(12) United States Patent
Zhao et al.

(10) Patent No.: US 9,627,414 B2
(45) Date of Patent: Apr. 18, 2017

(54) METALLIC OXIDE THIN FILM TRANSISTOR, ARRAY SUBSTRATE AND THEIR MANUFACTURING METHODS, DISPLAY DEVICE

(71) Applicant: BOE TECHNOLOGY GROUP CO., LTD., Beijing (CN)

(72) Inventors: Lei Zhao, Beijing (CN); Wei Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/771,267

(22) PCT Filed: Dec. 24, 2014

(86) PCT No.: PCT/CN2014/093649
§ 371 (c)(1),
(2) Date: Aug. 28, 2015

(87) PCT Pub. No.: WO2016/019672
PCT Pub. Date: Feb. 11, 2016

(65) Prior Publication Data
US 2016/0365366 A1    Dec. 15, 2016

(30) Foreign Application Priority Data
Aug. 6, 2014    (CN) .......................... 2014 1 0384418

(51) Int. Cl.
*H01L 29/786*    (2006.01)
*H01L 27/12*     (2006.01)
(Continued)

(52) U.S. Cl.
CPC ...... *H01L 27/1225* (2013.01); *H01L 21/0273* (2013.01); *H01L 21/02565* (2013.01);
(Continued)

(58) Field of Classification Search
CPC ............. H01L 27/1225; H01L 27/1288; H01L 29/7869
See application file for complete search history.

(56) References Cited

U.S. PATENT DOCUMENTS 7,981,720 B2 * 7/2011 Kim .................. H01L 21/02554
                                                    438/104
8,097,881 B2 * 1/2012 Lee .................... H01L 29/7869
                                                    257/347
(Continued)

FOREIGN PATENT DOCUMENTS

CN     101036879 A     9/2007
CN     101211735 A     7/2008
(Continued)

OTHER PUBLICATIONS

First Office Action regarding Chinese Application No. 201410384418.7 dated Jul. 18, 2016. Translation provided by Dragon Intellectual Property Law Firm.
(Continued)

*Primary Examiner* — Evan Pert
(74) *Attorney, Agent, or Firm* — Harness, Dickey & Pierce, P.L.C.

(57) ABSTRACT

The present invention provides a metallic oxide thin film transistor and its manufacturing method, an array substrate and its manufacturing method, as well as a display device, which is belong to the field of thin film transistor manufacturing technology. The method for manufacturing the metallic oxide thin film transistor comprises a step of forming patterns of an oxide active layer and an etch stopping layer through a one-time patterning process.

18 Claims, 3 Drawing Sheets

(51) Int. Cl.
*H01L 21/34* (2006.01)
*H01L 21/02* (2006.01)
*H01L 21/027* (2006.01)
*H01L 21/467* (2006.01)
*H01L 21/4757* (2006.01)
*H01L 29/24* (2006.01)
*H01L 29/423* (2006.01)
*H01L 29/66* (2006.01)

(52) U.S. Cl.
CPC ............ *H01L 21/34* (2013.01); *H01L 21/467* (2013.01); *H01L 21/47573* (2013.01); *H01L 27/12* (2013.01); *H01L 27/124* (2013.01); *H01L 27/1288* (2013.01); *H01L 29/24* (2013.01); *H01L 29/42356* (2013.01); *H01L 29/66969* (2013.01); *H01L 29/786* (2013.01); *H01L 29/7869* (2013.01); *H01L 29/78696* (2013.01)

(56) References Cited

U.S. PATENT DOCUMENTS

| | | | |
|---|---|---|---|
| 2008/0258140 A1* | 10/2008 | Lee | H01L 21/02554 257/43 |
| 2010/0252832 A1 | 10/2010 | Asano et al. | |
| 2013/0280859 A1 | 10/2013 | Kim et al. | |
| 2013/0313530 A1* | 11/2013 | Seo | H01L 29/66969 257/40 |
| 2015/0076488 A1* | 3/2015 | Kishi | H01L 29/7869 257/43 |
| 2016/0013320 A1* | 1/2016 | Yim | H01L 29/66969 257/43 |
| 2016/0276492 A1* | 9/2016 | Takeda | H01L 29/66969 |

FOREIGN PATENT DOCUMENTS

| | | |
|---|---|---|
| CN | 101615613 A | 12/2009 |
| CN | 102629574 A | 8/2012 |
| CN | 102629628 A | 8/2012 |
| CN | 102651341 A | 8/2012 |
| CN | 102723367 A | 10/2012 |
| CN | 102983135 A | 3/2013 |
| CN | 103117224 A | 5/2013 |
| CN | 103178021 A | 6/2013 |
| CN | 103693860 A | 4/2014 |
| CN | 104167365 A | 11/2014 |

OTHER PUBLICATIONS

Written Opinion of the International Searching Authority regarding International Application No. PCT/CN2014/093649. Translation provided by Dragon Intellectual Property Law Firm.

Second Office Action regarding Chinese application No. 201410384418.7, dated Dec. 30, 2016. Translation provided by Dragon Intellectual Property Law Firm.

* cited by examiner

Prior Art

METALLIC OXIDE THIN FILM TRANSISTOR, ARRAY SUBSTRATE AND THEIR MANUFACTURING METHODS, DISPLAY DEVICE

CROSS-REFERENCE TO RELATED APPLICATION

This application is the U.S. national phase of PCT Application No. PCT/CN2014/093649 filed on Dec. 12, 2014, which claims a priority to Chinese Patent Application No. 201410384418.7 filed on Aug. 6, 2014, the disclosure of which is incorporated in its entirety by reference herein.

TECHNICAL FIELD

The present disclosure relates to the field of a process for manufacturing a thin film transistor, in particular to a metallic oxide thin film transistor, an array substrate and their manufacturing methods, as well as a display device.

DESCRIPTION OF THE PRIOR ART

A thin film transistor liquid crystal display (TFT-LCD) is characterized by small size, low power consumption, no radiation, etc., and has taken a dominant position in the current flat-panel display market.

In recent years, the TFT-LED has been developing rapidly, especially for a liquid crystal display television, which has been improving in its size and resolution. Accordingly, a liquid crystal display television with a large size and a high resolution becomes a mainstream of TFT-LCD development. Along with gradually improvements in larger size and higher resolution of the TFT-LCD, it is evitable to use a driving circuit having a higher frequency to improve a display quality, which causes a more serious image signal delays, thereby the signal delay becomes one of critical factors limiting a display effect of the TFT-LCD with the large size and high resolution.

Along with a gradually increasing size of the liquid crystal display and a gradual increasing frequency of the driving circuit, it is very difficult to meet requirement on a migration rate of an amorphous-silicon thin film transistor in the prior art, which is generally of about 0.5 $cm^2/Vs$. For a liquid crystal display having a size over 80 inch and a driving frequency of 120 Hz, it requires a migration rate of 1 $cm^2/Vs$ or more, which is obviously hard to be met by the amorphous-silicon thin film transistor in the prior art. Although the polycrystalline silicon thin film transistor is of a relative high migration rate, it is of poor uniformity and complex manufacturing process. A metallic oxide thin film transistor is of high migration rate, good uniformity and simple manufacturing process, thereby meet the requirements on the high migration rate of a liquid crystal display with large size and high refresh frequency and the an active organic electroluminescence device.

A metallic oxide thin film transistor, as represented by that made of indium gallium zinc oxide (IGZO, an amorphous oxide containing indium, gallium and zinc), is of a carrier mobility 20 to 30 times as compared to that of an amorphous silicon, so that it may accelerate a charge-discharge velocity of a pixel electrode by the TFT, accelerate a response speed of a pixel and achieve a more rapid refresh rate, thereby accelerate a line-scanning rate of the pixel, enabling the TFT-LCD to realize an ultrahigh resolution. In addition, as the IGZO may also improve light transmittance of each pixel, the display device may be of higher energy efficiency.

In the prior art, the metallic oxide thin film transistor is generally manufactured by a four-times or five-times patterning process. The IGZO is corroded at a rapid corrosion rate in a conventional etchant for etching a source/drain metal layer, and IGZO is sensitive to water and oxygen, therefore it is required to a step of forming an etch stopping (ESL) on a metallic oxide semiconductor layer so as to protect the metallic oxide semiconductor layer from being corroded by the etchant for etching the source/drain metal layer. However, such step increases complexities in structure and manufacturing process of the metallic oxide thin film transistor, thereby decrease its productivity. In addition, as IGZO is sensitive to ultraviolet light, an electrical property of the metallic oxide thin film transistor is severely shifted under ultraviolet radiation; thereby adversely affect stability and yield of good IGZO-TFT.

SUMMARY OF THE INVENTION

An object of the present disclosure is to provide a metallic oxide thin film transistor, an array substrate and their manufacturing methods, as well as a display device, which can simplify the process for manufacturing the metallic oxide thin film transistor, reduce its manufacturing cost, and improve stability and yield of good metallic thin film transistor.

The present disclosure provides the following technical solutions in its embodiment.

In an aspect, the present disclosure provides a method for manufacturing a metallic oxide thin film transistor, comprising a step of forming patterns of an oxide active layer and an etch stopping layer of the metallic oxide thin film transistor through a one-time patterning process.

Alternatively, the etch stopping layer is made of $TiO_2$ or a mixture of $TiO_2$ and $CeO_2$.

Alternatively, in the one-time patterning process, the pattern of an etch stopping layer is formed by a dry etching process, and the pattern of an oxide active layer is formed by a wet etching process.

Alternatively, the step of forming patterns of an oxide active layer and an etch stopping layer of the thin film transistor through a one-time process comprises:

depositing an metallic oxide semiconductor layer and an etch stopping layer on a substrate successively;

coating a photoresist onto the etch stopping layer, exposing and developing the photoresist with a halftone or a greytone mask plate so as to form patterns including a photoresist unreserved region, a photoresist partly reserved region and a photoresist completely reserved region;

etching off the etch stopping layer at the photoresist unreserved region through a dry etching process, and etching off the metallic oxide semiconductor layer at the photoresist unreserved region through a wet etching process, so as to form a pattern of an metallic oxide semiconductor;

removing the photoresist in the photoresist partly reserved region by ashing, etching off the etch stopping layer at the photoresist partly reserved region through a dry etching process, so as to form a pattern of the etch stopping layer;

subjecting the metallic oxide semiconductor layer which is not covered by the etch stopping layer to plasma treatment so as to form the oxide active layer; and peeling off the photoresist at the photoresist completely reserved region.

Alternatively, the step of depositing the etch stopping layer on a substrate includes:

subjecting $Ti(OC_4H_9)_4$ to bubbling treatment with $N_2$; and depositing $Ti(OC_4H_9)_4$ subjected to the bubbling treatment on the substrate by means of metal vapor deposition under an oxygen atmosphere so as to form a $TiO_2$ film; or depositing metal Ti on the substrate by means of direct current magnetron sputtering under an oxygen atmosphere so as to form the $TiO_2$ film; or depositing a mixture of $CeO_2$ and $TiO_2$ on a substrate by means of magnetron sputtering so as to form a film of a mixture of $CeO_2$ and $TiO_2$.

Alternatively, the substrate comprises a base substrate and a portion of film layers formed on the base substrate.

Alternatively, an etchant gas used in the dry etching process is $CF_4$, a mixture of $CF_4$ and $O_2$, $CCl_4$, $BCl_3$, a mixture of $BCl_3$ and $Cl_2$.

Alternatively, based on a total weight of a mixture of $CeO_2$ and $TiO_2$, $TiO_2$ is of a content of from about 40 wt % to about 50 wt %.

Alternatively, the method includes:

providing a base substrate;

forming a gate electrode and a gate line on the base substrate through a one-time patterning process;

forming a gate insulting layer on the substrate formed with the gate electrode and the gate line;

forming patterns of the oxide active layer and the etch stopping layer on the gate insulating layer through a one-time patterning process; and forming a source electrode, a drain electrode and a data line on the substrate formed with the patterns of the oxide active layer and the etch stopping layer through a one-time patterning process.

In a second aspect, the present disclosure provides a method for manufacturing a metallic oxide thin film transistor array substrate, the method comprises, subsequent to a step of manufacturing the metallic oxide thin film transistor by the method as described above, forming a passivation layer with a via hole on the substrate formed with a source electrode, a drain electrode and a data line through a single patterning process; and forming a pixel electrode on the passivation layer through a one-time patterning process, wherein the pixel electrode is connected to the drain electrode through the via hole.

In yet a third aspect, the present disclosure provides a metallic oxide thin film transistor manufactured by the above method, wherein a source and a drain electrode of the thin film transistor are connected to an oxide active layer where is uncovered by the etch stopping layer.

Alternatively, the etch stopping layer is made of $TiO_2$ or a mixture of $TiO_2$ and $CeO_2$.

Alternatively, the etch stopping layer is of a thickness of from about 1000 Å to about 6000 Å.

Alternatively, based on a total weight of a mixture of $TiO_2$ and $CeO_2$, $TiO_2$ is of a content of from about 40 wt % to about 50 wt %.

Alternatively, the oxide active layer is made of indium gallium zinc oxide, indium tin zinc oxide or zinc oxynitride, and the oxide active layer is of a thickness of about 500 Å to about 5000 Å.

Alternatively, the metallic oxide thin film transistor includes:

a base substrate;

a gate electrode and a gate line located on the base substrate;

a gate insulating layer located on the base substrate formed with the gate electrode and the gate line;

patterns of the oxide active layer and the etch stopping layer located on the gate insulating layer; and a source electrode, a drain electrode and a data line located on the base substrate formed with the patterns of the oxide active layer and the etch stopping layer.

In still a fourth aspect, the present disclosure provides an array substrate which comprises the above metallic oxide thin film transistor, a passivation layer with a via hole located on the base substrate formed with a source electrode, a drain electrode and a data line; and a pixel electrode on the passivation layer, wherein the pixel electrode is connected to the drain electrode through the via hole.

In still a fifth aspect, the present disclosure provides a display device which comprises the above array substrate.

The present disclosure has the following advantageous effects:

In the embodiments of the present disclosure, the patterns of the oxide active layer and the etch stopping layer of the metallic thin film are formed by a one-time patterning process so that the process of manufacturing the metallic oxide thin film transistor is simplified, thereby its manufacturing cost is reduced and its productivity is improved.

DETAILED DESCRIPTION

In order to make the technical problems to be solved by the present disclosure, the technical solutions and the advantages of the present disclosure more apparent, the present disclosure will be described hereinafter in conjunction with the drawings and the embodiments.

Aiming at a complex process for manufacturing a metallic oxide thin film transistor in the prior art, the present disclosure provides a metallic oxide thin film transistor, an array substrate and their manufacturing methods, as well as a display device, which can simplify complexities of the process for manufacturing the metallic oxide thin film transistor, reduce cost for manufacturing the metallic oxide thin film transistor, and improve stability and yield of the metallic oxide thin film transistor.

In an aspect, the present disclosure provides a method for manufacturing a metallic oxide thin film transistor, which comprises forming patterns of an oxide active layer and an etch stopping layer of the thin film transistor through a one-time patterning process. The above method can simplify a process for manufacturing a metallic thin film transistor, thus reduce the manufacturing cost for manufacturing a metallic thin film transistor, and improve productivity of a metallic thin film transistor.

Alternatively, the etch stopping layer is made of $TiO_2$, or a mixture of $TiO_2$ and $CeO_2$, i.e., a $TiO_2$ or $CeO_2$:$TiO_2$ film is taken as the etching stopping layer. As $TiO_2$ is of an excellent ultraviolet light-absorbing property, the etch stopping layer may also be taken as an ultraviolet light-absorbing layer, which can effectively avoid a phenomenon that an electrical property of a metallic oxide semiconductor material is shifted under an ultraviolet irradiation, and thus improve stability and yield of a metallic oxide thin film transistor.

Alternatively, in the one-time patterning process, the pattern of an etch stopping layer is formed via a dry etching process, and the pattern of an oxide active layer is formed via a wet etching process.

Alternatively, the step of forming patterns of an oxide active layer and an etch stopping layer of the thin film transistor through a one-time patterning process comprises:

depositing a metallic oxide semiconductor layer and an etch stopping layer successively on a substrate, wherein the substrate including a base substrate and a portion of film layers formed on the base substrate;

applying a photoresist on the etch stopping layer, exposing and developing with a halftone mask plate or a grey tone mask plate so as to form a pattern including a photoresist unreserved region, a photoresist partly reserved region and a photoresist completely reserved region;

etching off the etching stopping layer in the photoresist unreserved region by a dry etching process, and etching off the metallic oxide semiconductor layer in the photoresist unreserved region by a wet etching process, so as to form a pattern of the metallic oxide semiconductor;

removing the photoresist in the photoresist partly reserved region by ashing, etching off the etch stopping layer in the photoresist partly reserved region by a dry etching process, so as to form a pattern of the etch stopping layer;

subjecting the metallic oxide semiconductor layer which is not covered by the etch stopping layer to plasma treatment, so as to form the oxide active layer; and peeling off the photoresist in the photoresist completely reserved region.

Alternatively, the step of depositing a etch stopping layer comprises:

subjecting $Ti(OC_4H_9)_4$ as a source material to bubbling treatment by introducing $N_2$ as a carrier gas with a predetermined flow; introducing $Ti(OC_4H_9)_4$ after being subjecting to the bubbling treatment and $O_2$ with a predetermined flow into a reactor; and depositing a layer of $TiO_2$ film on a substrate by means of metal vapor deposition; or depositing a layer of $TiO_2$ film on a substrate with metal Ti as a target material by means of direct current magnetron sputtering under an oxygen atmosphere; or depositing a layer of a film of a mixture of $CeO_2$ and $TiO_2$ on a substrate by means of magnetron sputtering, wherein the mixture of $CeO_2$ and $TiO_2$ at a predetermined ration is taken as a target material.

Alternatively, the substrate includes a base substrate and a portion of film layers formed on the base substrate.

Alternatively, an etching gas used in the dry etching process is $CF_4$, a mixture of $CF_4$ and $O_2$, $CCl_4$, $BCl_3$, a mixture of $BCl_3$ and $Cl_2$.

Alternatively, the method for manufacturing the metallic thin film transistor comprises:

providing a base substrate;

forming a gate electrode and a gate line on the base substrate by a one-time patterning process;

forming a gate insulating layer on the base substrate with the gate electrode and the gate line;

forming patterns of an oxide active layer and an etch stopping layer on the gate insulating layer by a one-time patterning process; and forming a source electrode, a drain electrode and a data line on the base substrate with the patterns of an oxide active layer and an etch stopping layer by a one-time patterning process.

In another aspect, the present disclosure provides a method for manufacturing a metallic oxide thin film transistor array substrate, comprising the above method for manufacturing the metallic oxide thin film transistor, and the method further including:

forming a passivation layer with a via hole on the base substrate with the source electrode, the drain electrode and the data line by a one-time patterning process;

forming a pixel electrode on the passivation layer by a one-time patterning process, wherein the pixel electrode is connected to the drain electrode through the via hole.

In yet another aspect, the present disclosure provides a metallic oxide thin film transistor manufactured by the above method, the source electrode and the drain electrode of the thin film transistor are connected to the oxide active layer which is not covered by the etch stopping layer.

Alternatively, the etch stopping layer is made of $TiO_2$ or a mixture of $TiO_2$ and $CeO_2$, i.e., a $TiO_2$ or $CeO_2$:$TiO_2$ film is taken as the etch stopping layer. As $TiO_2$ is of an excellent ultraviolet light-absorbing property, the etch stopping layer may also be taken as an ultraviolet light-absorbing layer, so as to avoid a phenomenon that an electrical property of a metallic oxide semiconductor material is shifted under an ultraviolet irradiation, and thus improve stability and yield of the metallic oxide thin film transistor.

Alternatively, the etch stopping layer is of a thickness of about 1000 Å to about 6000 Å, so that the etch stopping layer may effectively protect the oxide active layer, and prevent the oxide active layer from being adversely affected by the ultraviolet irradiation.

Alternatively, based on the total weight of the mixture of $TiO_2$ and $CeO_2$, $TiO_2$ is of a content of 40 wt % to 50 wt %.

Alternatively, the oxide active layer is made of indium gallium zinc oxide (IGZO), indium tin zinc oxide (ITZO) or nitrogen zinc oxide ($ZnON_x$, x is in the range of 0.01 to 0.99). The oxide active layer is of a thickness of, for example, about 500 Å to about 5000 Å.

Alternatively, the thin film transistor includes:

a base substrate;

a gate electrode and a gate line located on the base substrate;

a gate insulating layer located on the base substrate formed with the gate electrode and the gate line;

patterns of an oxide active layer and an etch stopping layer located on the gate insulating layer; and a source electrode, a drain electrode and a data line located on the substrate formed with the patterns of the oxide active layer and the etch stopping layer.

In yet another aspect, the present disclosure provides a metallic oxide thin film transistor array substrate comprising the above metallic oxide thin film transistor; and the array substrate further comprises a passivation layer with a via hole located on a base substrate formed with the source electrode, the drain electrode and the data line; and a pixel electrode located on the passivation layer, wherein the pixel electrode is connected to the drain electrode through the via hole.

In still yet another aspect, the present disclosure provides a display device, including the above metallic oxide thin film transistor array substrate. Since the structure of the array substrate is the same as that in above embodiments, there is no repeated description herein. In addition, structures of other parts in the display device may refer to the related art, which are not described in details herein. The display device may be any product or component having a display function such as a display panel, an electronic paper, a television, a display, a digital frame, a mobile phone and a tablet computer.

The metallic oxide thin film transistor and its manufacturing method will be described in details in conjunction with specific embodiments below.

Figure 1:
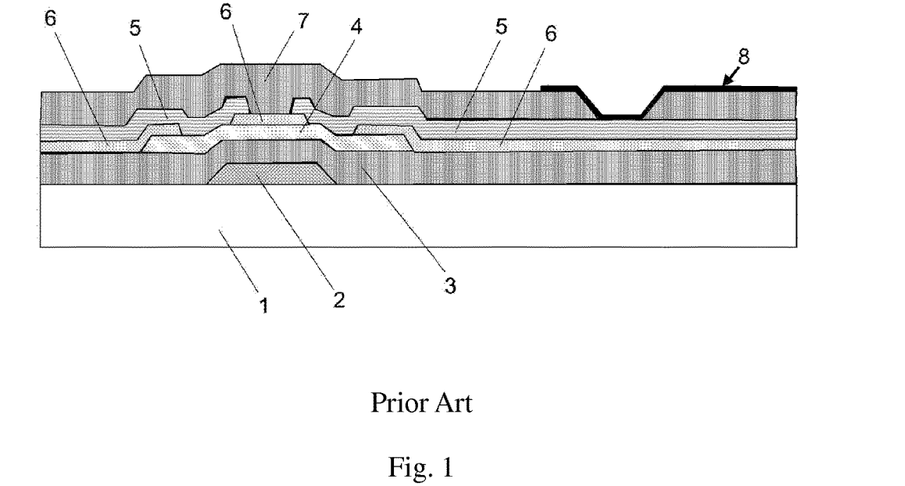
FIG. 1 a schematic view showing a metallic oxide thin film transistor array substrate manufactured by six-times patterning processes in the prior art.

The metallic oxide semiconductor material, such as IGZO, is quickly corroded in a conventional etchant solution for etching source/drain metal layer; and sensitive to water and oxygen, therefore it is required to form an etch stopping layer to protect an oxide active layer made of the metallic oxide semiconductor material during the process of manufacturing the metallic oxide thin film transistor, thereby prevent the oxide active layer from being corroded by the etchant for etching source/drain metal layer. However, such method increases complexity of the structure and the process of the thin film transistor, which decreases yield of the metallic oxide thin film transistor. The metallic oxide thin film transistor manufactured through four-time or five-time patterning process in the prior art, is manufactured by such method through six-time or seven-time patterning process. FIG. 1 is a schematic view showing a metallic oxide thin film transistor array substrate manufactured through six-time patterning processes in the related art. In addition, as the metallic oxide semiconductor material, such as IGZO, is sensitive to ultraviolet light, then its electronic property is severely shifted under the ultraviolet irradiation, thereby the stability and yield of the IGZO-TFT is adversely affected.

Figure 2:
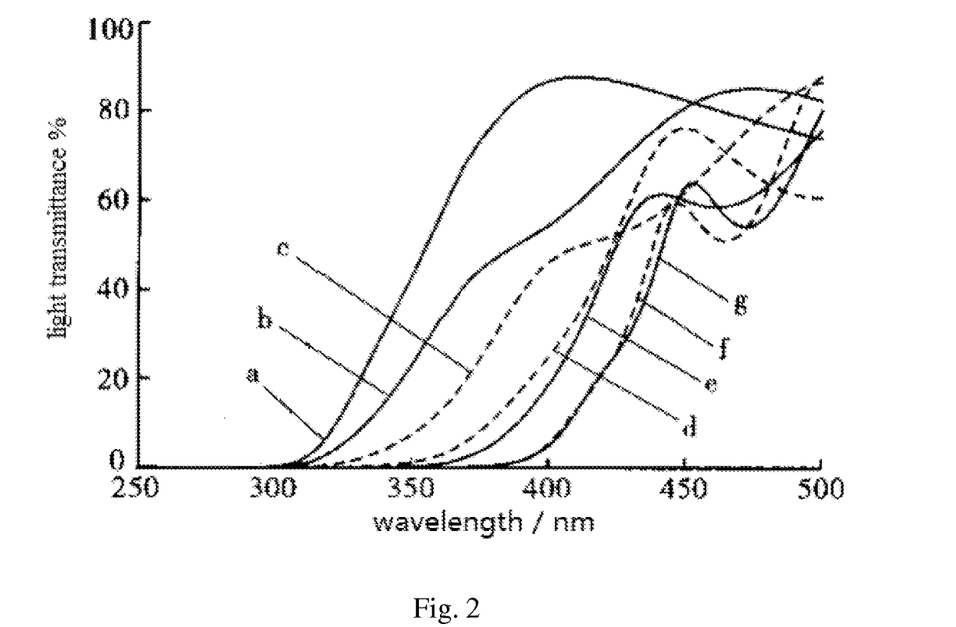
FIG. 2 is a diagram showing ultraviolet absorption spectrums of $TiO_2$ and a mixture of $CeO_2$ and $TiO_2$ according to the embodiments of the present disclosure.

The $TiO_2$ film is of a multifunctional material, has a high refractive index and a high dielectric constant, and has advantages such as being manufactured by a simple process, a stable property, and being easy to be patterned. FIG. 2 is a diagram showing ultraviolet absorption spectrums of $TiO_2$ and $CeO_2:TiO_2$ according to one embodiments of the present disclosure, respectively, in which: curve a is an ultraviolet absorption spectrum of $TiO_2$; curve b is an ultraviolet absorption spectrum of a $CeO_2:TiO_2$ mixture film when $CeO_2:TiO_2=0.9:0.1$; curve c is an ultraviolet absorption spectrum of a $CeO_2:TiO_2$ mixture film when $CeO_2:TiO_2=0.8:0.2$; curve d is an ultraviolet absorption spectrum of a $CeO_2:TiO_2$ mixture film when $CeO_2:TiO_2=0.7:0.3$; curve e is an ultraviolet absorption spectrum of a $CeO_2:TiO_2$ mixture film when $CeO_2:TiO_2=0.6:0.4$; curve f is an ultraviolet absorption spectrum of a $CeO_2:TiO_2$ mixture film when $CeO_2:TiO_2=0.5:0.5$; and curve g is an ultraviolet absorption spectrum of a $CeO_2:TiO_2$ mixture film when $CeO_2:TiO_2=0.4:0.6$.

As the curve a shown in FIG. 2, the $TiO_2$ film is of a higher absorption to ultraviolet light having a wavelength below 300 nm. After doping $CeO_2$ with $TiO_2$, the $CeO_2:TiO_2$ film is of an ultraviolet absorption spectrum starting from 400 nm, as the curve g shown in FIG. 2. In addition, each of $TiO_2$ film and $CeO_2:TiO_2$ film has an excellent compactness so as to effectively protect the metallic oxide semiconductor material. Therefore, according to an embodiments of the present disclosure, $TiO_2$ film and $CeO_2:TiO_2$ film is used to manufacture the etch stopping layer, so as to protect the metallic oxide semiconductor material, and absorb ultraviolet light, and prevent the property of the metallic oxide semiconductor material from being adversely affected. Thus the stability and yield of the metallic oxide semiconductor can be improved.

In specific, in the present embodiment, the method for manufacturing the metallic oxide thin film transistor comprises the following steps.

Step 1: providing a base substrate 1, forming a gate electrode 2 and a gate line (not shown) on the base substrate 1. The base substrate is a glass or quartz substrate. For example, a gate metal layer having a thickness of 500 Å to 4000 Å may be deposited on the base substrate 1 by sputtering or thermal evaporation. The gate metal layer may be made of Cu, Al, Ag, Mo, Cr, Nd, Ni, Mn, Ti, Ta or W, or an alloy thereof. The gate metal layer may be of a single-layered structure, or a multi-layered structure such as Cu/Mo, Ti/Cu/Ti or Mo/Al/Mo. A layer of photoresist 9 is coated onto the gate metal layer and then exposed with a mask plate, so as to form a photoresist reserved region, which corresponds to regions where the patterns of the gate line and the gate electrode 2 are located, and a photoresist unreserved region, which corresponds to a region other than the above patterns. Then exposed photoresist is developed so as to fully remove the photoresist 9 in the photoresist unreserved region and a thickness of the photoresist 9 at the photoresist reserved region is kept constant. The gate metal layer in the photoresist unreserved region is fully etched off by an etching process, and then the remaining photoresist 9 is removed so as to form patterns of the gate line and the gate electrode 2.

Step 2: forming a gate insulating layer 3 on the base substrate obtained in Step 1. For example, a gate insulating layer 3 having a thickness of about 500 Å to about 5000 Å may be deposited on the base substrate obtained in Step 1 by plasma enhanced chemical vapor deposition (PECVD). The gate insulating layer 3 may be made of an oxide, a nitride or an oxynitride. A reacting gas for forming the silicon nitride may be a mixture of $SiH_4$, $NH_3$ and $N_2$. A reacting gas for forming the silicon oxide may be a mixture of $SiH_4$ and $NO_2$. A reacting gas for forming the silicon oxynitride may be a mixture of $SiH_4$, $N_2O$, $NH_3$ and $N_2$.

Figure 3A:
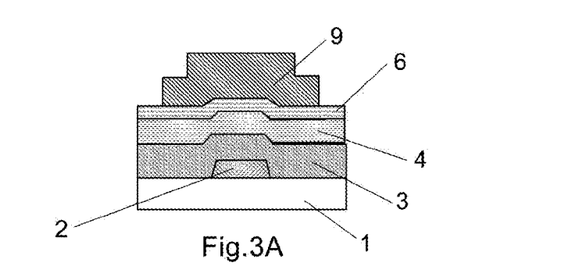
FIGS. 3A-3E are schematic views showing steps of manufacturing an oxide active layer and an etch stopping layer according to the embodiments of the present disclosure.

Step 3: forming patterns of an oxide active layer 4 and an etch stopping layer 6 on the base substrate obtained in Step 2. In specific, as shown in FIG. 3A, a metallic oxide semiconductor layer and a $TiO_2$ or $CeO_2:TiO_2$ film are deposited on the base substrate obtained in Step 2 successively. The metallic oxide semiconductor layer may be made of indium gallium zinc oxide (IGZO), indium tin zinc oxide (ITZO) or nitrogen zinc oxide (ZnONx, x is in the range of 0.01 to 0.99). The metallic oxide semiconductor is of a thickness of about 500 Å to about 5000 Å. The $TiO_2$ or $CeO_2:TiO_2$ film is of a thickness of about 1000 Å to about 6000 Å. When the $CeO_2:TiO_2$ film is taken as the etch stopping layer, based on the total weight of the mixture of $CeO_2$ and $TiO_2$, $TiO_2$ is of a content of about 40 wt % to about 50 wt %.

Methods for manufacturing the $TiO_2$ film mainly include a sol-gel method, an organic electrosynthesis method, a chemical vapor deposition method (CVD) and a physical vapor deposition (PVD) method. In specific, $Ti(OC_4H_9)_4$ as a source material is subjected to bubbling treatment by introducing $N_2$ as a carrier gas with a predetermined flow; then $Ti(OC_4H_9)_4$ after being subjected to the bubbling treatment and $O_2$ with a predetermined flow are introduced into a reactor; and a layer of $TiO_2$ film is deposited on a substrate by means of metal vapor deposition, or a layer of $TiO_2$ film is deposited on a substrate with metal Ti as a target material by means of direct current magnetron sputtering under an $O_2$ atmosphere, or a layer of a film of a mixture of $CeO_2$ and $TiO_2$ is deposited on the substrate by means of magnetron sputtering, wherein the mixture is taken as a target material by mixing $CeO_2$ and $TiO_2$ at a predetermined ration. A photoresist 9 is applied onto the $TiO_2$ or $CeO_2$:$TiO_2$ film and then exposed with a halftone mask plate or a greytone mask plate, so as to form patterns including a photoresist unreserved region, a photoresist partly reserved region and a photoresist completely reserved region.

Figure 3B:
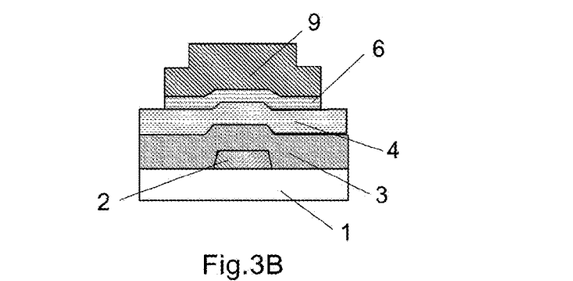

As shown in FIG. 3B, the $TiO_2$ or $CeO_2$:$TiO_2$ film in the photoresist unreserved region is etched off by a dry etching process. An etching gas used in the dry etching process may be $CF_4$, a mixture of $CF_4$ and $O_2$, $CCl_4$, $BCl_3$, or a mixture of $BCl_3$ and $Cl_2$.

Figure 3C:
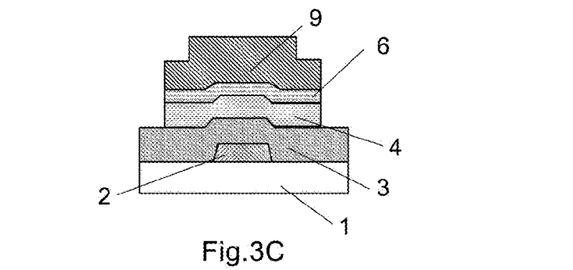

As shown in FIG. 3C, the metallic oxide semiconductor layer in the photoresist unreserved region is etched off by a wet etching process, so as to form a pattern of the metallic oxide semiconductor layer.

Figure 3D:
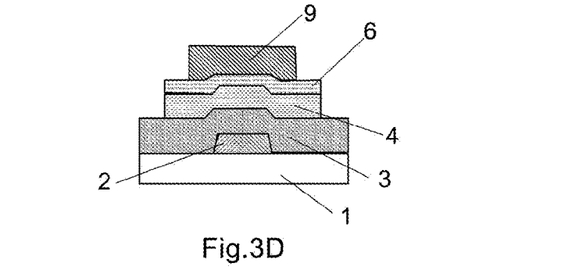

As shown in FIG. 3D, the photoresist 9 at the photoresist partly reserved region is removed by ashing.

Figure 3E:
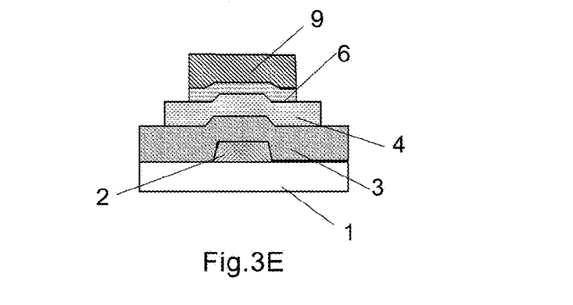

As shown in FIG. 3E, the $TiO_2$ or $CeO_2$:$TiO_2$ film in the photoresist partly reserved region is etched off by a dry etching process, so as to form a pattern of the etch stopping layer 6. The metallic oxide semiconductor layer where is not covered by the etch stopping layer 6 is subjected to plasma treatment using $CF_4$ or a mixture of $CF_4$ and $O_2$, so as to form an oxide active layer 4. Then the photoresist 9 at the photoresist completely reserved region is peeled off.

According to the present embodiment, the patterns of the oxide active layer and the etch stopping layer are formed by a one-time patterning process, so as to reduce manufacturing cost and the number of the patterning processes caused by the increasing number of the etch stopping layer, and prevent the oxide active layer from being damaged due to etching of the source/drain metal layer.

Step 4: forming patterns of a data line, a source electrode and a drain electrode on the base substrate obtained in Step 3. In details, a source/drain metal layer 5 having a thickness of about 2000 Å to about 4000 Å may be deposited on the base substrate obtained in Step 3 by magnetron sputtering, thermal evaporation or any other film-forming methods. The source/drain metal layer 5 may be made of Cu, Al, Ag, Mo, Cr, Nd, Ni, Mn, Ti, Ta or W, or an alloy thereof. The source/drain metal layer 5 may be of a single-layered structure, or a multi-layered structure such as Cu/Mo, Ti/Cu/Ti or Mo/Al/Mo. A photoresist 9 is coated onto the source/drain metal layer 5 and then exposed with a mask plate, so as to form a photoresist reserved region, which corresponds to regions where the patterns of the source electrode, the drain electrode and the data line are located, and a photoresist unreserved region, which corresponds to a region other than the above patterns. Then, the exposed photoresist is developed so as to fully remove the photoresist 9 at the photoresist unreserved region and a thickness of the photoresist 9 in the photoresist reserved region is kept constant. The source/drain metal layer 5 in the photoresist unreserved region is fully etched off by an etching process, and then the remaining photoresist 9 is removed, so as to form the data line, the source electrode and the drain electrode.

Figure 4:
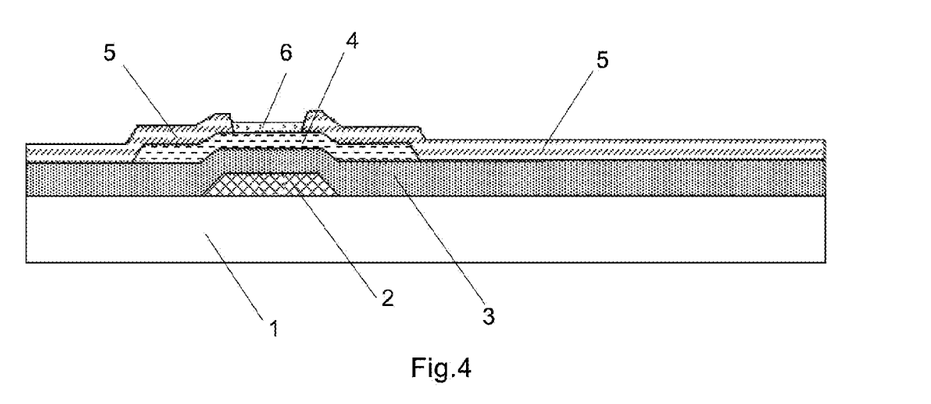
FIG. 4 is a schematic view of a metallic oxide thin film transistor manufactured by a method according to the embodiments of the present disclosure.

The metallic oxide thin film transistor according to the present embodiment may be manufactured by Steps 1 to 4. The metallic oxide thin film transistor is of a cross-section shown as FIG. 4. It can be seen from that the etch stopping layer 6 is formed on the oxide active layer 4, the source and drain electrodes are connected to the oxide active layer 4 where is not covered by the etch stopping layer 6.

Based on completeness of the above Steps 1 to 4, an array substrate including the above metallic oxide thin film transistor may be further manufactured. In specific, besides the above Steps 1 to 4, the method for manufacturing the array substrate further includes Steps 5 and 6.

Step 5: forming a passivation layer 7 with a via hole on the base substrate obtained in Step 4. In specific, a passivation layer 7 having a thickness of about 2000 Å to about 10000 Å may be deposited on the base substrate 1 obtained in Step 4 by magnetron sputtering, thermal evaporation or any other film-forming methods. The passivation layer 7 may be made of an oxide, a nitride or an oxynitride. Specifically, a passivation layer material may be $SiN_x$, $SiO_x$ or $Si(ON)_x$. The passivation layer 7 may be further made of $Al_2O_3$. The passivation layer may be of a single-layered structure, or a double-layered structure of silicon nitride and silicon oxide. A reacting gas for forming the silicon nitride may be a mixture of $SiH_4$, $NH_3$ and $N_2$. A reacting gas for forming the silicon oxide may be a mixture of $SiH_4$ and $NO_2$. A reacting gas for forming the silicon oxynitride may be a mixture of $SiH_4$, $N_2O$, $NH_3$ and $N_2$. The pattern of the passivation layer with the via hole is formed by a one-time patterning process. In specific, a layer of an organic resin having a thickness of about 4000 Å to about 30000 Å may be coated on the passivation layer 7. The organic region may be made of benzocyclobutene (BCB), or other organic photosensitive materials. After exposed and developed, the pattern of the passivation layer with the via hole is formed through a one-time etching process.

Step 6: forming a pattern of a pixel electrode 8 on the base substrate obtained in Step 5. In specific, a transparent conductive layer having a thickness of about 300 Å to about 1500 Å may be deposited on the base substrate obtained in Step 5 by magnetron sputtering, thermal evaporation or any other film-forming methods. The transparent conductive layer may be ITO, IZO or any other transparent metallic oxide. A layer of photoresist 9 is coated onto the transparent conductive layer and then exposed with a mask plate, so as to form a photoresist reserved region, which corresponds to a region where the pattern of the pixel electrode is located, and a photoresist unreserved region, which corresponds to a region other than the above pattern. Then, the exposed photoresist is developed so as to fully remove the photoresist 9 at the photoresist unreserved region, and a thickness of the photoresist 9 in the photoresist reserved region is kept constant. The transparent conductive layer in the photoresist unreserved region is fully etched off by an etching process, and then the remaining photoresist 9 is removed, so as to form the pattern of the pixel electrode 8. The pixel electrode 8 is connected to the drain electrode through the via hole.

Figure 5:
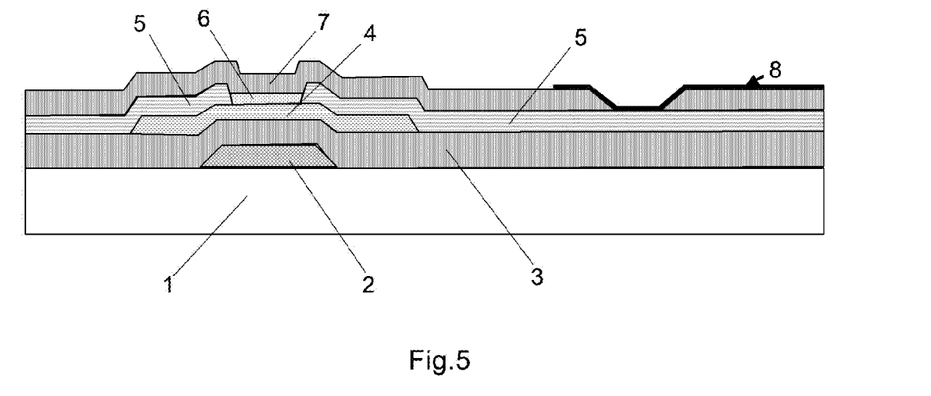
FIG. 5 is a schematic view of a metallic oxide thin film transistor array substrate manufactured by a method according to the embodiments of the present disclosure.

The metallic oxide thin film transistor array substrate may be manufactured by the above Steps 1 to 6, having a cross-section shown as FIG. 5.

According to one embodiments of the present disclosure, the patterns of the oxide active layer and the etch stopping layer are formed by means of a wet etching process and a dry etching process in a one-time patterning process with a halftone or greytone mask plate, respectively. The method for manufacturing a metallic oxide thin film transistor is simplified from four-time patterning process to three-time patterning process without introducing any new equipment or any new film layer, thereby prevent the oxide active layer from being damaged, decrease manufacturing cost, and improve productivity of the metallic oxide thin film transistor. Further, according to the present disclosure, the $TiO_2$ or $CeO_2$:$TiO_2$ is taken as an etch stopping layer. As the $TiO_2$ is of an excellent ultraviolet light-absorbing property, the etch stopping layer may absorb the ultraviolet light, thereby effectively avoid a phenomenon that the electrical property of the metallic oxide material is shifted under the ultraviolet radiation, and stability and yield of the metallic oxide thin film transistor can be improved.

The above are merely the exemplified embodiments of the present disclosure. It should be appreciated that, a person skilled in the art may make further improvements and modifications without departing from the principle of the present disclosure, and these improvements and modifications shall also fall within the scope of the present disclosure.

What is claimed is:

1. A method for manufacturing a metallic oxide thin film transistor, comprising a step of forming patterns of an oxide active layer and an etch stopping layer through a one-time patterning process, wherein the etch stopping layer is made of $TiO_2$ or a mixture of $TiO_2$ and $CeO_2$.

2. The method according to claim 1, wherein in the one-time patterning process, the pattern of an etch stopping layer is formed by a dry etching process, and the pattern of an oxide active layer is formed by a wet etching process.

3. The method according to claim 1, wherein the step of forming patterns of an oxide active layer and an etch stopping layer of the thin film transistor by a one-time patterning process comprises:
   depositing an metallic oxide semiconductor layer and an etch stopping layer on a substrate successively;
   coating a photoresist onto the etch stopping layer, exposing and developing with a halftone or a greytone mask plate, so as to form patterns including a photoresist unreserved region, a photoresist partly reserved region and a photoresist completely reserved region;
   etching off the etch stopping layer in the photoresist unreserved region through a dry etching process, and etching off the metallic oxide semiconductor layer in the photoresist unreserved region through a wet etching process, so as to form a pattern of an metallic oxide semiconductor layer;
   removing the photoresist in the photoresist partly reserved region through ashing, etching off the etch stopping layer in the photoresist partly reserved region through a wet etching process, so as to form a pattern of the etch stopping layer;
   subjecting the metallic oxide semiconductor layer which is not covered by the etch stopping layer to plasma treatment, so as to form the oxide active layer; and
   peeling off the photoresist in the photoresist completely reserved region.

4. The method according to claim 3, wherein the step of depositing the etch stopping layer on the substrate comprises:
   subjecting $Ti(OC_4H_9)_4$ to bubbling treatment with $N_2$; and
   depositing $Ti(OC_4H_9)_4$ after being subjected to the bubbling treatment on the substrate by means of metal vapor deposition under an oxygen atmosphere, so as to form a $TiO_2$ film; or depositing metal Ti on the substrate by means of direct current magnetron sputtering under an oxygen atmosphere, so as to form the $TiO_2$ film; or depositing a mixture of $CeO_2$ and $TiO_2$ on a substrate by means of magnetron sputtering, so as to form a film of a mixture of $CeO_2$ and $TiO_2$.

5. The method according to claim 3, wherein the substrate comprises a base substrate and a portion of film layer formed on the base substrate.

6. The method according to claim 3, wherein an etchant gas used in the dry etching process is $CF_4$, a mixture of $CF_4$ and $O_2$, $CCl_4$, $BCl_3$, or a mixture of $BCl_3$ and $Cl_2$.

7. The method according to claim 4, wherein based on a total weight of the mixture of $CeO_2$ and $TiO_2$, $TiO_2$ is of a content of about 40 wt % to about 50 wt %.

8. The method according to claim 3, comprising:
   providing a base substrate;
   forming a gate electrode and a gate line on the base substrate through a one-time patterning process;
   forming a gate insulting layer on the substrate formed with the gate electrode and the gate line;
   forming patterns of the oxide active layer and the etch stopping layer on the gate insulating layer through a one-time patterning process; and
   forming a source electrode, a drain electrode and a data line on the substrate formed with the patterns of the oxide active layer and the etch stopping layer through a one-time patterning process.

9. A method for manufacturing a metallic oxide thin film transistor array substrate, comprising: after manufacturing the metallic oxide thin film transistor according to claim 1, forming a passivation layer with a via hole on the substrate formed with a source electrode, a drain electrode and a data line through a one-time patterning process; and
   forming a pixel electrode on the passivation layer through a one-time patterning process, wherein the pixel electrode is connected to the drain electrode through the via hole.

10. A metallic oxide thin film transistor manufactured by the method according to claim 1, wherein source and drain electrodes of the thin film transistor are connected to an oxide active layer which is not covered by the etch stopping layer.

11. The metallic oxide thin film transistor according to claim 10, wherein the etch stopping layer is of a thickness of about 1000 Å to about 6000 Å.

12. The metallic oxide thin film transistor according to claim 10, wherein based on a total weight of the mixture of $TiO_2$ and $CeO_2$, $TiO_2$ is of a content of about 40 wt % to about 50 wt %.

13. The metallic oxide thin film transistor according to claim 10, wherein the oxide active layer is made of indium gallium zinc oxide, indium tin zinc oxide or nitrogen zinc oxide, and the oxide active layer is of a thickness of about 500 Å to about 5000 Å.

14. The metallic oxide thin film transistor according to claim 10, comprising:
   a base substrate;
   the gate electrode and the gate line located on the base substrate;
   the gate insulating layer located on the base substrate formed with the gate electrode and the gate line;
   the patterns of the oxide active layer and the etch stopping layer located on the gate insulating layer; and
   the source electrode, the drain electrode and the data line located on the base substrate formed with the patterns of the oxide active layer and the etch stopping layer.

15. An array substrate, comprising the metallic oxide thin film transistor according to claim 10, a passivation layer with a via hole located on the base substrate formed with the source electrode, the drain electrode and the data line; and a pixel electrode on the passivation layer, wherein the pixel electrode is connected to the drain electrode through the via hole.

16. A display device, comprising an array substrate according to claim 15.

17. A method for manufacturing a metallic oxide thin film transistor array substrate, comprising: after manufacturing the metallic oxide thin film transistor according to claim 8, forming a passivation layer with a via hole on the substrate formed with a source electrode, a drain electrode and a data line through a one-time patterning process; and forming a pixel electrode on the passivation layer through a one-time patterning process, wherein the pixel electrode is connected to the drain electrode through the via hole.

18. A metallic oxide thin film transistor manufactured by the method according to claim 8, wherein source and drain electrodes of the thin film transistor are connected to an oxide active layer which is not covered by the etch stopping layer.

\* \* \* \* \*